(12) United States Patent
Bhunia et al.

(10) Patent No.: US 9,252,069 B2
(45) Date of Patent: Feb. 2, 2016

(54) HIGH POWER MODULE COOLING SYSTEM

(75) Inventors: Avijit Bhunia, Agoura Hills, CA (US);
Alex P. Moffatt, Thousand Oaks, CA (US); Mark R. Gardner, Oxnard, CA (US); Chung-Lung Chen, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 641 days.

(21) Appl. No.: 12/873,226

(22) Filed: Aug. 31, 2010

(65) Prior Publication Data
US 2012/0048515 A1 Mar. 1, 2012

(51) Int. Cl.
H05K 7/20 (2006.01)
H01L 23/373 (2006.01)
H01L 23/473 (2006.01)

(52) U.S. Cl.
CPC ........ H01L 23/3735 (2013.01); H01L 23/4735 (2013.01); H01L 2224/32225 (2013.01); H01L 2224/48091 (2013.01); H01L 2224/48227 (2013.01); H01L 2224/73265 (2013.01); H01L 2924/19107 (2013.01)

(58) Field of Classification Search
USPC ........................................................ 361/677
See application file for complete search history.

(56) References Cited

U.S. PATENT DOCUMENTS

| | | | |
|---|---|---|---|
| 5,168,348 A | 12/1992 | Chu et al. | |
| 5,270,572 A | 12/1993 | Nakajima et al. | |
| 5,316,075 A | 5/1994 | Quon et al. | |
| 5,353,865 A * | 10/1994 | Adiutori et al. | 165/133 |
| 5,719,444 A | 2/1998 | Tilton et al. | |
| 5,959,351 A * | 9/1999 | Sasaki et al. | 257/714 |
| 5,966,291 A * | 10/1999 | Baumel et al. | 361/707 |
| 5,978,220 A * | 11/1999 | Frey et al. | 361/699 |
| 6,414,867 B2 * | 7/2002 | Suzuki et al. | 363/141 |
| 6,452,798 B1 * | 9/2002 | Smith et al. | 361/699 |
| 6,473,303 B2 * | 10/2002 | Kaufmann | 361/699 |
| 6,594,149 B2 | 7/2003 | Yamada et al. | |
| 6,650,542 B1 * | 11/2003 | Chrysler et al. | 361/699 |
| 6,736,192 B2 * | 5/2004 | Chang | 165/80.3 |
| 6,738,253 B2 * | 5/2004 | Beuille et al. | 361/679.53 |
| 6,993,926 B2 | 2/2006 | Rini et al. | |
| 6,994,151 B2 * | 2/2006 | Zhou et al. | 165/80.4 |
| 7,035,104 B2 * | 4/2006 | Meyer | 361/700 |
| 7,042,725 B2 | 5/2006 | Martin et al. | |
| 7,092,254 B1 | 8/2006 | Monsef et al. | |
| 7,173,823 B1 * | 2/2007 | Rinehart et al. | 361/699 |
| 7,190,581 B1 | 3/2007 | Hassani et al. | |
| 7,255,153 B2 * | 8/2007 | Berger et al. | 165/80.4 |
| 7,336,486 B2 * | 2/2008 | Mongia | 361/695 |
| 7,353,859 B2 | 4/2008 | Stevanovic et al. | |
| 7,369,409 B2 * | 5/2008 | Yazawa | 361/698 |
| 7,375,962 B2 | 5/2008 | Campbell et al. | |
| 7,417,857 B2 | 8/2008 | Rondier et al. | |

(Continued)

Primary Examiner — Courtney Smith
(74) Attorney, Agent, or Firm — Brooks Acordia IP Law, P.C.

(57) ABSTRACT

A cooling apparatus includes a direct-bonded copper ("DBC") substrate, the DBC substrate having a plurality of micro-structure tabs formed on a fluid impingement side of the DBC substrate, and a jet head in complementary opposition to the fluid impingement side. The jet head has a first plurality of micro-jets facing the fluid impingement side, each of the first plurality of micro-jets having a nozzle, and a second plurality of micro-jets facing the fluid impingement side so the jet head is configured to deliver a fluid to the plurality of micro-structure tabs through the first and second plurality of micro-jets.

25 Claims, 4 Drawing Sheets

(56) References Cited

U.S. PATENT DOCUMENTS

| | | |
|---|---|---|
| 7,450,378 B2 | 11/2008 | Nelson et al. |
| 7,536,870 B2 | 5/2009 | Bezama et al. |
| 7,755,898 B2* | 7/2010 | Aoki et al. .................... 361/710 |
| 7,760,503 B2* | 7/2010 | Aoki et al. .................... 361/699 |
| 7,859,103 B2* | 12/2010 | Aoki et al. .................... 257/714 |
| 7,884,468 B2* | 2/2011 | Mann et al. .................... 257/714 |
| 7,992,627 B2* | 8/2011 | Bezama et al. ............. 165/80.4 |
| 2001/0014029 A1* | 8/2001 | Suzuki et al. ................ 363/141 |
| 2002/0144785 A1* | 10/2002 | Srivastava et al. ....... 156/345.35 |
| 2003/0056892 A1* | 3/2003 | Petitbon et al. ............ 156/272.8 |
| 2004/0069451 A1* | 4/2004 | Meyer ......................... 165/80.2 |
| 2004/0140053 A1* | 7/2004 | Srivastava et al. ....... 156/345.39 |
| 2005/0092403 A1* | 5/2005 | Lloyd ........................... 148/565 |
| 2005/0199372 A1* | 9/2005 | Frazer et al. ................ 165/80.4 |
| 2006/0042825 A1* | 3/2006 | Lu et al. ....................... 174/252 |
| 2006/0060328 A1* | 3/2006 | Ewes et al. .................. 165/80.2 |
| 2006/0087816 A1* | 4/2006 | Ewes et al. ................... 361/704 |
| 2006/0108098 A1* | 5/2006 | Stevanovic et al. .......... 165/80.4 |
| 2006/0164805 A1* | 7/2006 | Meinders et al. ............. 361/689 |
| 2006/0174643 A1* | 8/2006 | Ostrom et al. ............... 62/259.2 |
| 2006/0250774 A1* | 11/2006 | Campbell et al. ............. 361/699 |
| 2007/0121299 A1* | 5/2007 | Campbell et al. ............. 361/710 |
| 2007/0295480 A1* | 12/2007 | Campbell et al. ............. 165/80.4 |
| 2008/0164010 A1* | 7/2008 | Kang et al. ................ 165/104.26 |
| 2008/0225482 A1* | 9/2008 | Smith et al. ................... 361/699 |
| 2008/0266801 A1 | 10/2008 | Weiss et al. |
| 2009/0014562 A1 | 1/2009 | Rini et al. |
| 2009/0032937 A1* | 2/2009 | Mann et al. .................... 257/712 |
| 2009/0033410 A1* | 2/2009 | Nelson et al. ................. 327/581 |
| 2009/0057882 A1 | 3/2009 | Gerbsch |
| 2009/0213546 A1* | 8/2009 | Hassani et al. ................ 361/702 |
| 2009/0314467 A1* | 12/2009 | Campbell et al. ............. 165/80.4 |
| 2010/0053889 A1* | 3/2010 | Miller et al. .................. 361/689 |
| 2010/0091457 A1* | 4/2010 | Krause .......................... 361/689 |
| 2010/0277868 A1* | 11/2010 | Beaupre et al. ............... 361/700 |
| 2011/0141690 A1* | 6/2011 | Le et al. ........................ 361/689 |

* cited by examiner

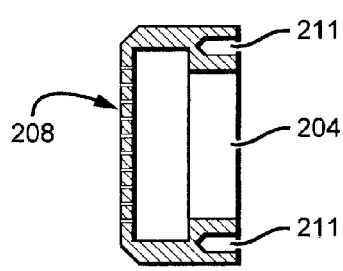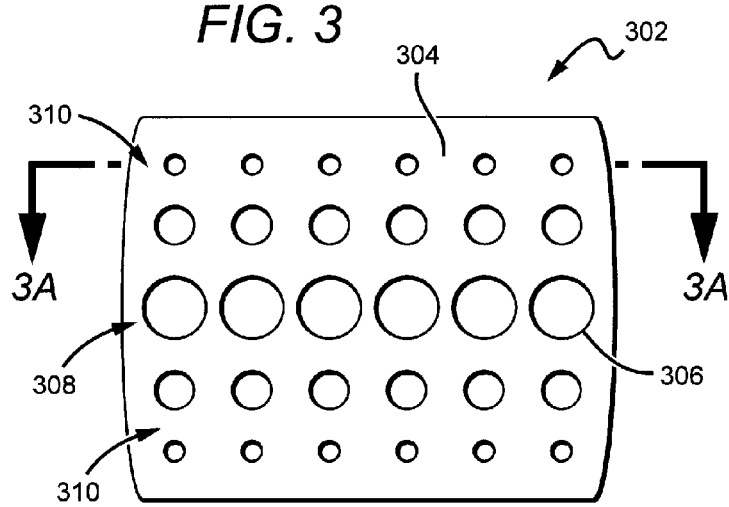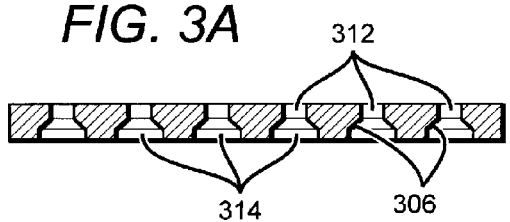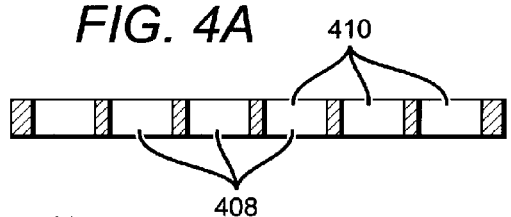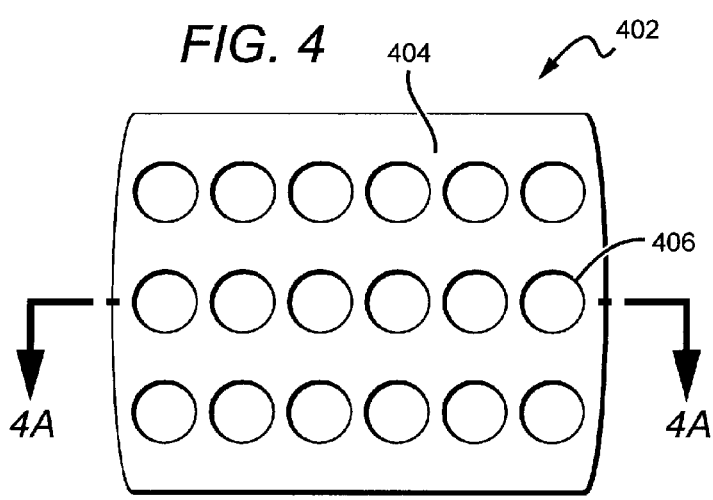

HIGH POWER MODULE COOLING SYSTEM

GOVERNMENTAL RIGHTS

This invention was made with Government support under Contract No. 71305 (ONR) awarded by the Office of Naval Research. The Government has certain rights in this invention.

BACKGROUND OF THE INVENTION

1. Field of the Invention

This invention relates to systems for cooling electronic devices, and particularly to systems for cooling high-power devices on a direct-bonded copper (DBC) substrate.

2. Description of the Related Art

Power dissipation in electronic circuits remains an important design consideration and is becoming more important as performance for such circuits is becoming thermally limited. For example, a power module having multiple high power devices sitting on a substrate needs to be cooled to prevent overheating and damage to the devices as well as to better-ensure long term reliability of the devices and their power connections. Many high power modules in commercial and military use are liquid cooled by forcing liquid flow through a pin fin base plate (cold plate), with the pin fins increasing the heat transfer surface area from an otherwise flat base plate. (See U.S. Pat. Nos. 6,594,149, 7,042,725, 7,417,857, 7,353,859). Unfortunately, such systems are limited by the cooling capability (h) of the forced convection and by thermal resistance over the base plate and solder layer. Other cooling solutions include evaporative spray cooling on custom-made base plates that have surface structures to enhance the heat transfer. (See U.S. Pat. No. 6,993,926 and US 2009/0014562). Such systems tend to be comparatively bulky and costly, however. Use of DBC substrates to mount high power devices in combination with direct impingement liquid cooling has been found to improve thermal resistance over the base plate and solder layer, but the no-fin DBC solutions suffer from substantial loss in back-side cooling surface area and so thermal dissipation is greatly limited by the liquid impingement flow rate. (See U.S. Pat. No. 7,190,581) Macro-scale fins may be attached DBC substrates, but such macro-scale fins block the liquid impingement path and are not made with commercially available DBC substrates thus adding cost to the total system solution.

A need still exists to provide for greater power dissipation for high power devices seated in power modules with more-uniformity of temperature among such devices while maintaining a compact and cost-effective system structure.

SUMMARY OF THE INVENTION

A cooling apparatus is disclosed that provides more-uniform temperatures for high power devices seated in a power module. It has a direct-bonded copper ("DBC") substrate, the DBC substrate having a plurality of micro-structure tabs formed on a fluid impingement side of the DBC substrate, and a jet head in complementary opposition to the fluid impingement side. The jet head has a first plurality of micro-jets facing the fluid impingement side, each of the first plurality of micro-jets having a nozzle, and a second plurality of micro-jets facing the fluid impingement side so the jet head is configured to deliver a fluid to the plurality of micro-structure tabs through the first and second plurality of micro-jets.

Also disclosed is a high-power module cooling method that includes pumping a phase-change fluid to a jet head, directing the phase-change fluid through a plurality of discrete clusters of micro-jets in the jet head to impinge on respective regions of micro-structure tabs formed on a fluid impingement side of a direct-bonded copper ("DBC") substrate, and transferring excess heat from a plurality of heat sources to the phase-change fluid through the DBC substrate to create vapor and heated liquid, each of the plurality of heat sources aligned with a respective one of the plurality of discrete clusters of micro-jets.

BRIEF DESCRIPTION OF THE DRAWINGS

The components in the figures are not necessarily to scale, emphasis instead being placed upon illustrating the principals of the invention. Like reference numerals designate corresponding parts throughout the different views.

FIGS. 2, 2A and 2B are plan, side and end views, respectively, of one embodiment of a jet head;

FIGS. 3 and 3A are overhead plan and cross-section views, respectively, of a jet head cluster that has exit nozzles of varying diameters;

FIGS. 4 and 4A are plan and cross-section views, respectively, of a jet head cluster that has exit nozzles that share the same diameter;

DETAILED DESCRIPTION OF THE INVENTION

Figure 1:
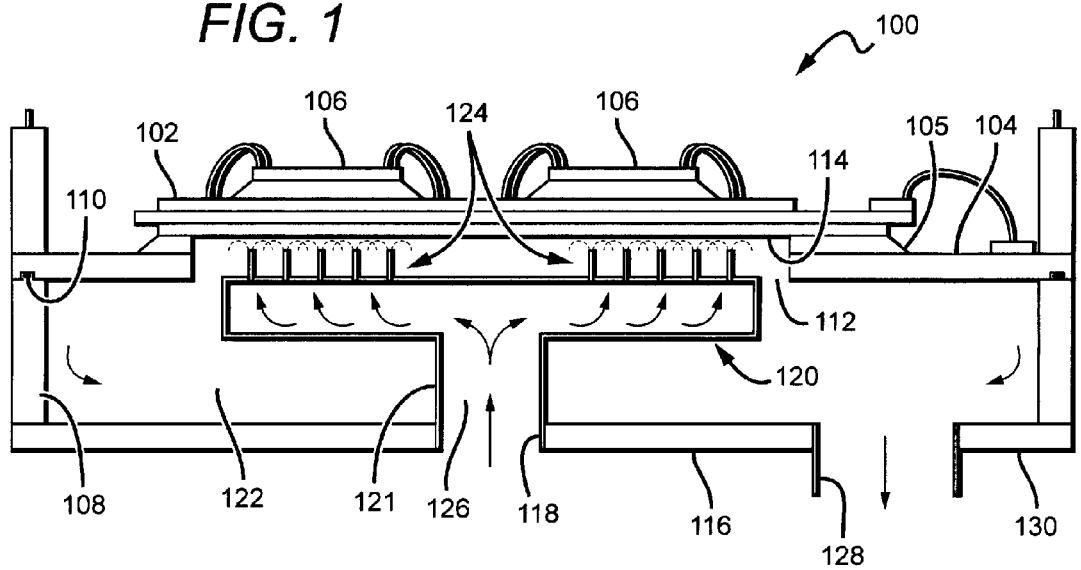
FIG. 1 is a block diagram illustrating one embodiment of a high-power module cooling apparatus that has a jet head with clusters of micro-jets facing a DBC substrate.

FIG. 1 illustrates one embodiment of a light-weight and compact high-power module cooling system 100 conformal to high power devices sitting on a substrate, with the high power devices and substrate collectively defining a "high power module." The cooling system uses a phase-change material, preferably a liquid to enable a micro-jet/droplet based spray cooling, in a low thermal resistance packaging architecture. The phase-change material is preferably water, but may be a dielectric liquid, a water and ethalene glycol (WEG) mixture or consist of a microencapsulated phase change material such as tetradecane or octadecane. A micro-structured direct bonded copper ("DBC") substrate 102 is thermally coupled to a module base plate 104, preferably a metal base plate formed of aluminum, aluminum silicon carbide or copper, for support and heat transfer. The DBC substrate 102 is thermally coupled to the module base plate 104 using a solder 105 such as SiIn or AuSn, or may be thermally coupled by other physical means such as brazing, to also provide resistance against transport of moisture between the DBC substrate 102 and module base plate 104. Hydrophobic epoxy and/or grease may also be provided along an outer perimeter of the solder joint to reduce liquid transport through the solder joint over time.

A plurality of high-power devices 106 may be seated in thermal communication with the DBC substrate 102 of the cooling apparatus 100, such as by soldering, to enable excess heat from the high-power devices to be conducted to the DBC substrate 102. The module base plate 104 is seated on a conformal cooling chamber frame 108 that supports the DBC substrate 102 through the base plate 104. The conformal cooling chamber frame is preferably metallic, such as aluminum, but may be formed of other rigid material. Preferably, an o-ring 110 is seated between the module base plate 104 and cooling chamber frame 108 to provide a liquid and vapor seal. The o-ring 110 is formed from an elastic material such as rubber, metal, nylon or other material that is appropriate to provide a liquid and vapor seal between the rigid module base plate 104 and cooling chamber frame 108. The module base plate 104 is provided with an opening 112 to expose a fluid impingement side 114 of the DBC substrate 102, with the opening aligned to encompass the high-power devices 106 seated on the opposite side of the DBC substrate 102. In an alternative embodiment, a plurality of openings (not shown) is provided in the module base plate 104 that each encompasses respective high-power devices on a side of the DBC substrate opposite from the fluid impingement side 114.

A cooling chamber base plate 116 of the cooling apparatus 100 has a jet head opening 118 to accept a jet head riser 121 that extends into an interior 122 of the module cooling system 100 to position the jet head 120 in complementary opposition to the fluid impingement side 114. The jet head 120 has a plurality of clusters of micro-jets 124 to direct liquid received into an interior 126 of the jet head 120 onto respective portions of the fluid impingement side that are aligned with or that otherwise target respective high power devices 106 on the power module seated on the opposite side of the DBC substrate 102.

A cooling chamber drain 128 is provided in a chamber base 130 of the cooling apparatus 100 to receive heated liquid and vapor to be evacuated for condensation and eventual recirculation to the jet head 120 and fluid impingement side 114.

During operation, a phase-change material is introduced into an interior of the jet head 126 at pressure to spray out through the plurality of clusters of micro-jets 124 to impinge on the fluid impingement side 114 through the opening 112. Excess heat generated by the high-power devices 106 is absorbed by the phase-change material impinging on the fluid impingement side 114 resulting in a partial to complete phase-change of the phase-change material thereby absorbing heat from the DBC substrate 102. The resulting material, preferably heated liquid and vapor, flows or is circulated to the cooling chamber drain 128 through the interior of the cooling apparatus 122 such as by gravity or pumping action. Similarly, a portion of the excess heat generated by the high-power devices 106 is conducted through the heat module base plate 104 through solder 105 to be absorbed by the heated liquid and vapor circulating through the interior of the cooling apparatus 122 prior to exiting the cooling apparatus 100 through the cooling chamber drain 128.

Figure 2:
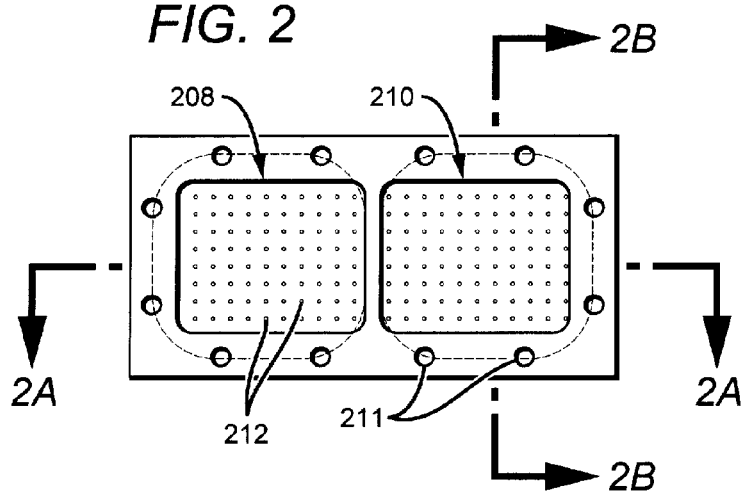
Figure 2A:
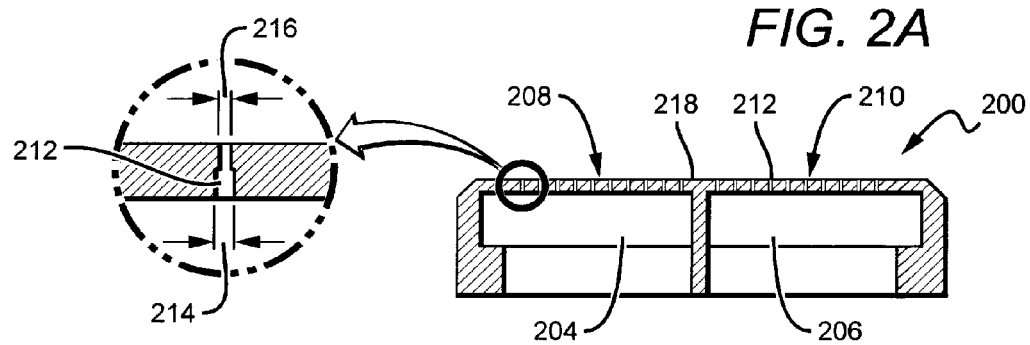

FIGS. 2, 2A and 2B illustrate one embodiment of the jet head first illustrated in FIG. 1. An interior of the jet head is segmented into left and right chambers (204, 206), preferably chambers of equal volume, to allow delivery of phase-change material to respective clusters of micro-jets (208, 210) that are positioned in complimentary opposition to or otherwise targeting respective high power devices 106 seated on an opposite side of the DBC substrate (not shown). Downstream portions of the left and right chambers (204, 206) are larger than upstream portions to maximize the micro-jet cluster areas (208, 210) while enabling provision of threaded portions 211 near a base of the jet head for assembly with the jet head riser (not shown). In an alternative embodiment, the clusters of micro-jets (208, 210) are of unequal area to uniquely target or otherwise align with heat sources of differing size. Each of the plurality of micro-jets 212 has an input diameter 214 and exit diameter 216 that preferably define a converging nozzle in relation to the direction of fluid flow from the interior left and right chambers (204, 206) to an exterior 218 of the jet head 200. The micro-jets 212 are illustrated as converging nozzles, with input diameters 214 formed by CNC machine countersinking holes. In an alternative embodiment, the larger input diameters 214 are formed by laser countersinking or by other methods. In one embodiment, input and output diameters are approximately 100-150 μm and 100 μm, respectively, and the micro-jet length is approximately 630 μm to produce a low pressure drop jet head.

In FIGS. 2 and 2A, the jet head 200 has approximately 252 equally-spaced micro-jets 212, with each micro-jet 212 having substantially similar exit nozzle diameters 216. Although the jet head 200 has a generally rectangular top cross section, the jet head 200 may be configured in a square, circular or polygonal top cross section shape to accomplish aligning each respective cluster of micro-jets (208, 210) in complementary opposition to respective heat sources such as high-power devices 106 (not shown).

FIGS. 3 and 3A illustrate a discrete micro-jet cluster 302 on a portion of a jet head 304 that has regions of differing exit nozzle diameters. The micro-jet cluster 302 is defined by central and outer micro-jet regions (308, 310). Each of the micro-jets 306 in the central micro-jet region 308 have respective exit nozzles 312, with the diameter of each exit nozzle 312 larger than the exit nozzle diameters of the micro-jets in the outer micro-jet region 310 to reduce the pressure drop in the jet head 304 from what would otherwise exist with identical exit nozzle diameters as between regions (308, 310). Although central and outer micro-jet regions (308, 310) are defined by linear rows of micro-jets, in an alternative embodiment such regions may be defined by circular regions of common exit nozzle diameters or regions defined by non-rectangular shapes to provide for a reduction in pressure drop in the jet head 304 from what would otherwise exist with identical micro-jet exit diameters within a micro-jet cluster.

FIG. 3A is a cross section view of FIG. 3 about the line 3A-3A. Micro-jets 306 each preferably have converging nozzles, with exit nozzles 312 having substantially similar diameters. In an alternative embodiment, such nozzles have input nozzles 314 that have the same diameter as their respective exit nozzles 312. Or, the micro-jets 306 incorporate other geometries to enable targeted spraying of phase-change material onto a respective heat source.

FIGS. 4 and 4A illustrate a single micro-jet cluster 402 on a portion of a jet head 404 that has substantially equal exit nozzle diameters across the micro jet cluster 402. Unlike the micro jets illustrated in FIGS. 3 and 3A, the micro jets 406 have exit diameters that do not vary as between micro jets across the micro jet cluster 402. FIG. 4A illustrates a cross section view about the line 4A-4A, with each micro-jet 406 having input and exit nozzles (408, 410) preferably having substantially similar diameters. Or, each micro jet 406 may have converging or diverging nozzles or have nozzles that incorporate other geometries to enable targeted spraying of phase-change material onto a respective heat source (not shown) positioned in complementary opposition to the micro jet cluster 402 while minimizing jet head pressure drop.

Figure 5:
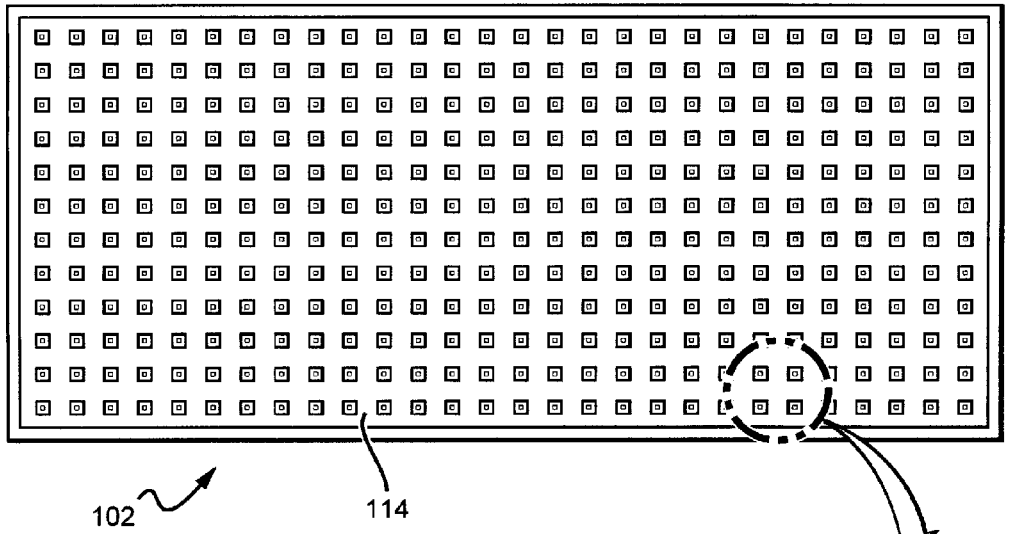
FIG. 5 is a plan view of a DBC substrate that has micro-structure tabs on its fluid-impinging surface that are, in one embodiment, polyhedron with a square base.

FIG. 5 illustrates one embodiment of the DBC substrate 102 first illustrated in FIG. 1, with the DBC substrate 102 having microstructure tabs 502 on its fluid impingement side 114. Each of the microstructure tabs 502 are preferably formed from a milling process into a polyhedron shape with a square base using a computed numerically controlled (CNC) machine and microsaw milling tool directly on the DBC substrate 102, such as on one of the 250 μm thick copper sides of a DBC substrate commonly found in the industry. Although preferably milled, the microstructure tabs 502 may be formed by etching or other suitable method for ease of manufacturing and to increase the overall surface area of the impingement side 114 for cooling of the high power module. The preferred height of each microstructure tab is comparable to the boundary layer thickness of the chosen phase-change material impinging on the impingement side during operation. For example, if water is used as a phase-change material for direct spray impingement on the fluid impingement side, each microstructure tab 502 preferably has a square base measuring 150 μm on each side, is 150 μm tall and forms a top square shelf 504 measuring 150 μm on each side in order to provide a continuous redevelopment of water thermal boundary layers during operation and to provide ridges to facilitate drainage of liquid away from the fluid impingement side 114, as the fluid impingement side 114 is preferably "upside down" in the system illustrated in FIG. 1. In such an embodiment, a DBC substrate 102 having a fluid impingement side measuring 52 mm×23 mm has 2300 microstructure tabs 502 spaced apart approximately 500-900 μm. The surface area of the fluid impingement side 114 is thus increased by approximately 22% in comparison to a flat surface to facilitate thermal transfer of excess heat from the DBC substrate to the impinging water during operation. In alternative implementations, approximately 24 to 2300 microstructure tabs are formed on the fluid impingement side to increase the surface area available for thermal transfer of excess heat from a heat source seated on the other side of the DBC substrate 102.

Figure 6:
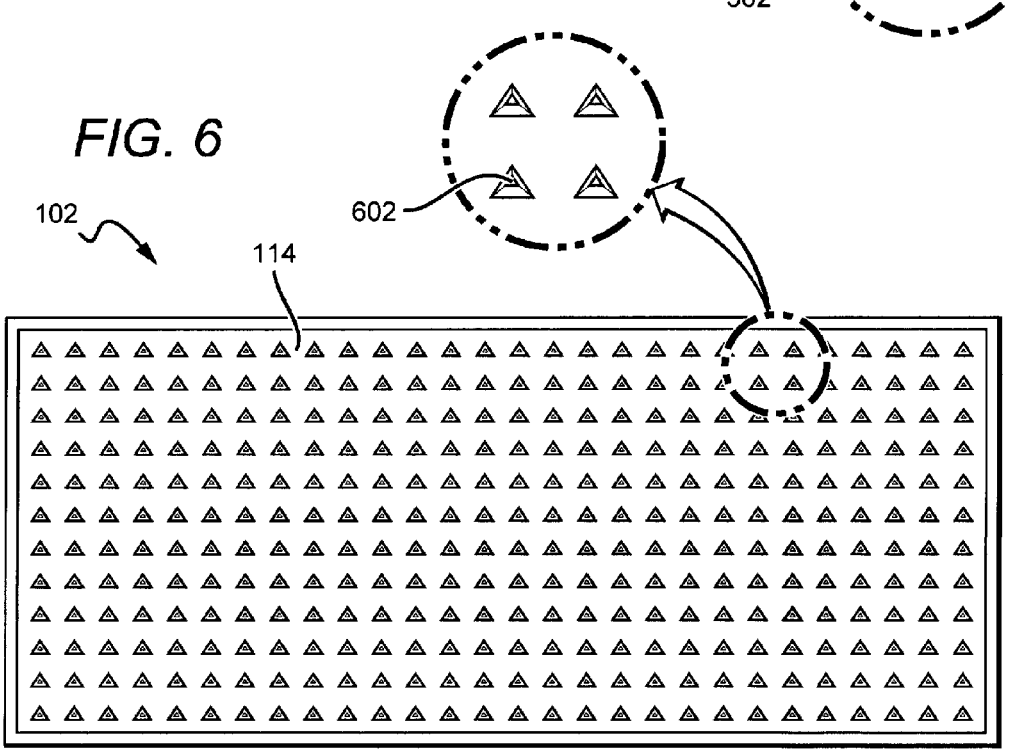
FIG. 6 is a plan view of a DBC substrate that has micro-structure tabs on its fluid-impinging surface that are, in another embodiment, polyhedron with a triangular base.

FIG. 6 illustrates an embodiment of the DBC substrate first illustrated in FIG. 1 that has microstructure tabs formed directly from its fluid-impinging surface that are polyhedron with a triangular base. Each microstructure tab 602 is preferably formed from a milling process such as with a CNC machine and microsaw milling tool directly from the existing DBC substrate 102 material, although they may be formed by etching or other suitable method such as that described in reference to FIG. 5. Similar to the described polyhedron shaped microstructure tabs having a square base, the preferred height of each microstructure tab 602 having a triangular base is comparable to the boundary layer thickness of the chosen phase-change material impinging on the impingement side 114 during operation. If water is used as a phase-change material for direct spray impingement on the fluid impingement side, each microstructure tab 602 preferably has a triangular base measuring 150 μm on each side and is 150 μm tall to provide a continuous redevelopment of a new water thermal boundary layers during operation and to provide ridges to facilitate drainage of liquid away from the fluid impingement side 114.

Figure 7:
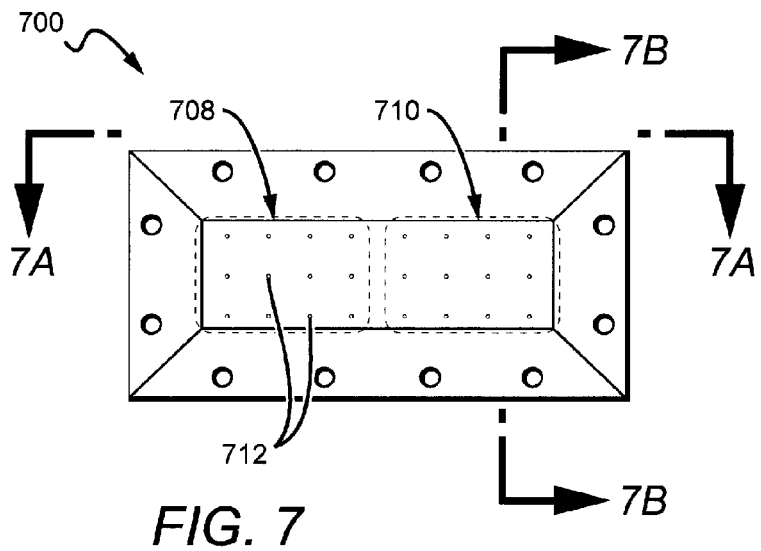
FIGS. 7, 7A and 7B are plan, side and cross-sectional views, respectively, of one embodiment of a jet head.
Figure 7B:
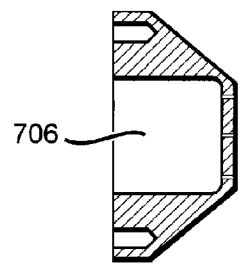
Figure 7A:
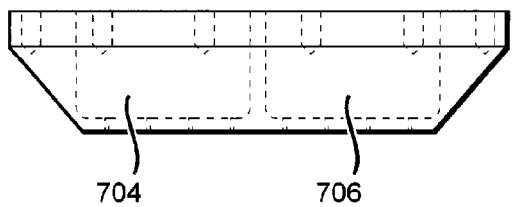

FIGS. 7, 7A and 7B illustrate another embodiment of the jet head first illustrated in FIG. 1. An interior of the jet head is segmented into left and right chambers (704, 706), preferably of equal volume, to allow delivery of phase-change material to respective clusters of micro-jets (708, 710) that are configured to target respective high power devices 106 sitting on an opposite side of the DBC substrate (not shown). In an alternative embodiment, the clusters of micro-jets (708, 710) are of unequal area to uniquely target heat sources of differing size. In FIG. 7, the jet head 700 has approximately 24 equally-spaced micro-jets 712. To increase the phase-change material flow out of the jet head 700, more micro-jets would be provided and fewer micro-jets may be provided to reduce the flow. Although the jet head 700 has a generally rectangular top cross section, the jet head 700 may be configured in a square, circular or polygonal top cross section shape to accomplish targeting each respective cluster of micro-jets (708, 710) in complementary opposition to respective heat sources such as high-power devices 106 (not shown).

Figure 8:
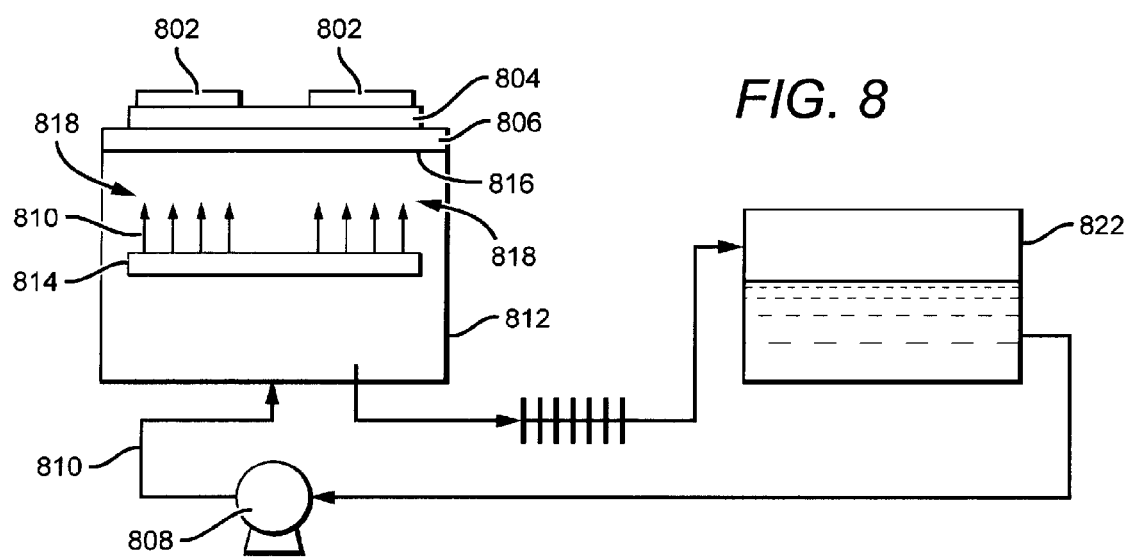
FIG. 8 is a one embodiment of a system for recirculating phase-change material from a tank, through a jet-head to impinge on a DBC substrate, through a heat exchanger and back to the tank.

FIG. 8 illustrates a power dissipation system for removing excess heat from heat sources seated on a DBC substrate. Heat sources 802 are seated on a DBC substrate 804 that is thermally coupled to a base plate 806. A pump 808 pumps phase-change material, preferably water 810, into a cooling chamber 812 through a jet head 814 in complementary opposition to a fluid impingement side 816 of the DBC substrate 804. The jet head 814 has a plurality of micro jet regions 818 aligned with respective heat sources 802 sitting on an opposite side of the DBC substrate to provide targeted cooling of the heat sources 802. Heated liquid and vapor produced from transfer of excess heat from the heat sources 802 to the water 810 is evacuated from the cooling chamber 812 and condensed through a heat exchanger H20 for storage into tank 822 for later recirculation to the jet head 814.

While various implementations of the application have been described, it will be apparent to those of ordinary skill in the art that many more embodiments and implementations are possible that are within the scope of this invention.

We claim:

1. A high-power module cooling apparatus, comprising:
   a direct-bonded copper ("DBC") substrate, said DBC substrate having a plurality of micro-studs formed on a fluid impingement side of said DBC substrate; and
   a jet head in complementary opposition to said fluid impingement side, said jet head comprising:
      a substantially planar upper surface in complementary opposition to said fluid impingement side; and
      a first cluster of micro-jets facing said fluid impingement side, each of said micro-jets having an exit nozzle that terminates co-planar with said upper surface; and
      a second plurality of micro-jets facing said fluid impingement side;
   wherein said jet head delivers a fluid to said plurality of micro-studs through said first and second plurality of micro-jets without said first and second plurality of micro-jets extending between said upper surface and said fluid impingement side to enable both confined micro-jet impingement and free surface micro-jet impingement.

2. The apparatus of claim 1, wherein said first cluster of micro-jets positioned in complementary opposition to a first heat source seated on an opposite side of said DBC substrate.

3. The apparatus of claim 2, wherein said second plurality of micro-jets is a second cluster of micro-jets set apart from said first cluster of micro-jets, said second cluster of micro-jets positioned in complementary opposition to a second heat source seated on the opposite side of said DBC substrate.

4. The apparatus of claim 3, wherein said first and second heat sources are each high power devices of a power module.

5. The apparatus of claim 1, wherein said first cluster of micro-jets is defined by central and outer micro-jet regions, said outer micro-jet regions bounding said central micro-jet region on at least two sides, and each of said nozzles in said central micro-jet region having a larger exit nozzle diameter than each of said nozzles in said outer micro-jet region.

6. The apparatus of claim 1, wherein said first plurality of micro-jets comprise micro-jets having converging nozzles.

7. The apparatus of claim 6, wherein said converging nozzles are countersunk nozzles.

8. The apparatus of claim 1, further comprising:
a base plate to seat said DBC substrate, said base plate having an opening to expose said fluid impingement side to said jet head.

9. The apparatus of claim 8, further comprising:
a conformal cooling chamber frame to receive said base plate.

10. The apparatus of claim 1, wherein said plurality of micro-studs are milled micro-studs.

11. The apparatus of claim 10, wherein said plurality of milled micro-studs are polyhedron with a square base.

12. The apparatus of claim 10, wherein said plurality of milled micro-studs are polyhedron with a triangular base.

13. The apparatus of claim 1, wherein said plurality of micro-studs are etched micro-studs.

14. A high-power module cooling apparatus, comprising:
a direct-bonded copper ("DBC") substrate, said DBC substrate having a plurality of milled micro-studs formed on a fluid impingement side of said DBC substrate; and
a jet head in complementary opposition to said fluid impingement side, said jet head comprising
a substantially planar upper surface in complementary opposition to said fluid impingement side;
a first cluster of micro-jets facing said fluid impingement side, each of said micro-jets in said first cluster having a nozzle; and
a second cluster of micro-jets set apart from said first cluster of micro-jets, said second cluster of micro-jets facing said fluid impingement side;
wherein said jet head delivers a phase-change material to said plurality of milled micro-studs through said first and second plurality of micro-jets without said first and second clusters of micro jets extending between said upper surface and said fluid impingement side to enable both confined micro-jet impingement and free surface micro-jet impingement.

15. The apparatus of claim 14, further comprising:
a first heat source seated on an opposite side of said DBC substrate and aligned with said first cluster of micro-jets; and
a second heat source seated on said opposite side of said DBC substrate and aligned with said second cluster of micro-jets;
wherein said first and second heat sources are targeted by said first and second clusters of microjets, respectively.

16. The apparatus of claim 14, wherein each of said micro-jets in said first cluster of micro-jets and said second cluster of micro-jets have an input diameter of about 100-150 μm, an output diameter of about 100 μm, and a length of about 630 μm.

17. The apparatus of claim 14, wherein each of said plurality of milled micro-studs has a depth of about 150 μm and at least one of: a square base measuring about 150 μm on each side, and a triangular base measuring about 150 μm on each side.

18. The apparatus of claim 1, wherein each of said micro-jets in said first cluster of micro-jets have approximately equal micro-jet lengths between an input orifice and an output orifice within each of said micro-jets.

19. The apparatus of claim 18, wherein said jet head further comprises first and second chambers of equal volume.

20. The apparatus of claim 19, wherein each of said first and second chambers have respective downstream portions that are larger than respective upstream portions.

21. The apparatus of claim 19, wherein each of said first and second chambers have respective constant cross section areas.

22. The apparatus of claim 2, wherein said first cluster of micro-jets is defined by central and outer micro-jet regions, said central micro-jet region corresponding to a central region of said first heat source, each of said exit nozzles in said central micro-jet region having a larger exit nozzle diameter than each of said exit nozzles in said outer micro-jet region.

23. The apparatus of claim 1, wherein said micro-studs are spaced apart between 500-900 microns.

24. The apparatus of claim 1, wherein said micro-studs do not form high-aspect ratio microchannels.

25. The apparatus of claim 1, wherein the micro-studs are a part of a layer of said DBC substrate so that a height of the micro-studs does not exceed the thickness of the layer.

* * * * *